United States Patent
Jun

(10) Patent No.: US 7,589,562 B2
(45) Date of Patent: Sep. 15, 2009

(54) I/O CELL CAPABLE OF FINELY CONTROLLING DRIVE STRENGTH

(75) Inventor: Jae Hun Jun, Gwangmyeong-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/646,461

(22) Filed: Dec. 28, 2006

(65) Prior Publication Data

US 2007/0152712 A1    Jul. 5, 2007

(30) Foreign Application Priority Data

Dec. 30, 2005    (KR) ...................... 10-2005-0134811

(51) Int. Cl.
*H03K 19/0175*    (2006.01)
(52) U.S. Cl. .......................................... 326/82; 361/56
(58) Field of Classification Search ............. 326/81–87; 361/54–56, 58, 91, 98, 111
See application file for complete search history.

(56) References Cited

U.S. PATENT DOCUMENTS

| 5,239,440 A | * | 8/1993 | Merrill ......................... 361/56 |
| 5,910,874 A | * | 6/1999 | Iniewski et al. ............... 361/56 |
| 5,933,025 A | * | 8/1999 | Nance et al. .................. 326/81 |
| 6,091,265 A | * | 7/2000 | Singh ........................... 326/83 |
| 6,600,347 B2 | * | 7/2003 | Borkenhagen et al. ...... 327/112 |
| 2007/0091524 A1 | * | 4/2007 | Davis ........................... 361/56 |

* cited by examiner

*Primary Examiner*—James Cho
*Assistant Examiner*—Christopher Lo
(74) *Attorney, Agent, or Firm*—Finnegan, Henderson, Farabow, Garrett & Dunner, L.L.P.

(57) ABSTRACT

Disclosed is an I/O cell for providing an output pad with an output signal, including a first drive circuit for providing the output pad with an output signal having a drive strength which is equal to a drive strength required by a basic PMOS transistor or a basic NMOS transistor, the first drive circuit further operating as an ESD protection circuit to protect the output pad from any errant electrostatic signal input thereto; and a at least one second drive circuit connected between an output of the first drive circuit and the output pad, the second drive circuit operating as an ESD protection circuit to further protect the output pad from any errant electrostatic signal input thereto.

8 Claims, 5 Drawing Sheets

I/O CELL CAPABLE OF FINELY CONTROLLING DRIVE STRENGTH

RELATED APPLICATION

This application is based upon and claims the priority to Korean Application No. 10-2005-0134811 filed on Dec. 30, 2005, the entire contents of which are incorporated herein by reference.

BACKGROUND

1. Technical Field

The present invention relates to an I/O cell capable of finely controlling drive strength.

2. Description of Related Art

A semiconductor integrated circuit device transmits and receives data to and from other external apparatuses using input/output circuits (also referred to as 'I/O cells'). An output cell in the I/O cell includes a drive circuit for loading a sufficient volume of data on an output pad and an ESD protection circuit for preventing a high voltage generated from an exterior from being transferred into the I/O cell or to the drive circuit.

FIG. 1 is a block circuit diagram illustrating a configuration of an I/O cell according to a related art.

Referring to FIG. 1, an output signal coming from terminal 12 is input into a drive circuit 20 through two inverters 14 and 16. Since the output signal of terminal 12 passes through two inverters 14 and 16, an output of inverter 16 has the same data value as the output signal of terminal 12, but its current capacity is higher than that of the output signal of terminal 12. The output of inverter 16 is input into a drive circuit 20. Drive circuit 20 is comprised of a pull-up transistor PC1 (PMOS transistor) pulling a voltage level on an output pad 40 up to a power supply voltage VDD and a pull-down transistor NC1 (NMOS transistor) pulling a voltage level of output pad 40 down to a ground voltage. Both transistors are being connected in the form of an inverter structure. That is, when the output signal on terminal 12 is "0", pull-up transistor PC1 is turned on, such that output pad 40 is connected to the power supply voltage. When the output signal on terminal 12 is "1", pull-down transistor NC1 is turned on, such that output pad 40 is connected to the ground voltage terminal.

I/O cell 10 typically has a separate electrostatic protection circuit 30, although, drive circuit 20 in I/O cell 10 may be adapted for electrostatic protection. Electrostatic protection circuit 30 includes a PMOS transistor PC2 connected as a diode between output pad 40 and power supply VDD; and a NMOS transistor NC2 connected as a diode between output pad 40 and the ground voltage terminal. Accordingly, PMOS transistor PC2 protects drive circuit 20 when a voltage signal higher than the power supply voltage is applied to output pad 40; and NMOS transistor NC2 protects drive circuit 20 when a voltage signal much lower than the ground voltage is applied to output pad 40.

When an electrostatic voltage is applied to output pad 40, drive circuit 20 as well as electrostatic protection circuit 30 enables the electrostatic signal to flow to VDD or the ground through PMOS transistor PC1 or NMOS transistor NC1, thereby, protecting the semiconductor integrated circuit from static electricity. Such an I/O cell 10 is called a self protection I/O cell 10. Since all transistors in self protection I/O cell 10 have to serve for the electrostatic protection, the size of the transistors should be a predetermined level or higher (both in width and length). A transistor whose size is the minimum level is called "a basic transistor" in this specification.

In order to make drive strength of self protection I/O cell 10 diverse, it should control the number of pull-up transistor PC1 and pull-down transistor NC1. For example, assuming that 10 basic transistors are prepared and the drive strength of the basic transistor is 2 mA; when the drive strength of I/O cell 10 is 4 mA, the drive circuit is formed of 2 basic transistors and the remaining 8 basic transistors are grounded and not used.

Therefore, the conventional self protection I/O cell has a shortcoming in that there is no alternative other than to control the drive strength as a multiple of the strength of the basic transistor. For example, when drive strength of a basic transistor that can constitute the pull-up transistor and the pull-down transistor is 2 mA, the drive strength can be extended only in an integer multiple of the basic strength in the art, such as 4 mA, 6 mA, 8 mA, and so on. Further, since an SoC (System on Chip) device used in mobile equipment require a variety of voltages depending on various operation modes (for example, sleep mode, normal mode, highest speed operation mode, etc.), the I/O cell should be able to control the drive strength correspondingly to the requirements. However, it is very difficult for the conventional I/O cell to control the drive strength in diverse and fine manners.

BRIEF SUMMARY

Consistent with the present invention there is provided an I/O cell capable of controlling drive strength thereof in a diverse manner.

According to the preferred embodiment consistent with the present invention, there is provided an I/O cell for providing an output pad with an output signal, including a first drive circuit for providing the output pad with an output signal having a drive strength which is equal to a drive strength required by a basic PMOS transistor or a basic NMOS transistor, the first drive circuit further operating as an ESD protection circuit to protect the output pad from any errant electrostatic signal input thereto; and a at least second drive circuit connected between an output of the first drive circuit and the output pad, the second drive circuit operating as an ESD protection circuit to further protect the output pad from any electrostatic signal input thereto, wherein the second drive circuit includes: a PMOS transistor whose gate input is a VPG voltage ranging from a power supply voltage minus a threshold voltage of a basic PMOS transistor to a ground voltage, and a NMOS transistor whose gate input is a VNV voltage ranging from the threshold voltage of a basic NMOS transistor minus the ground voltage to the power supply voltage.

DETAILED DESCRIPTION

Hereinafter, a description about an I/O cell according to embodiments consistent with the present invention will be made with reference to the accompanying drawings.

Figure 1:
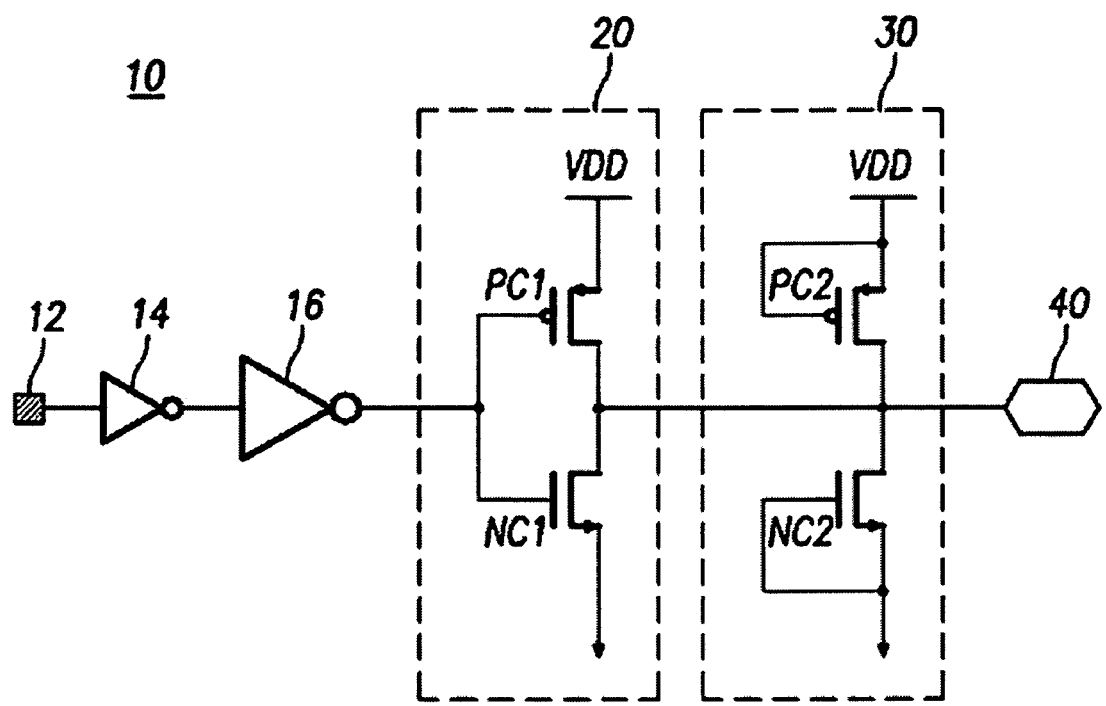
FIG. 1 is a circuit diagram of an I/O cell according to the related art.
Figure 2:
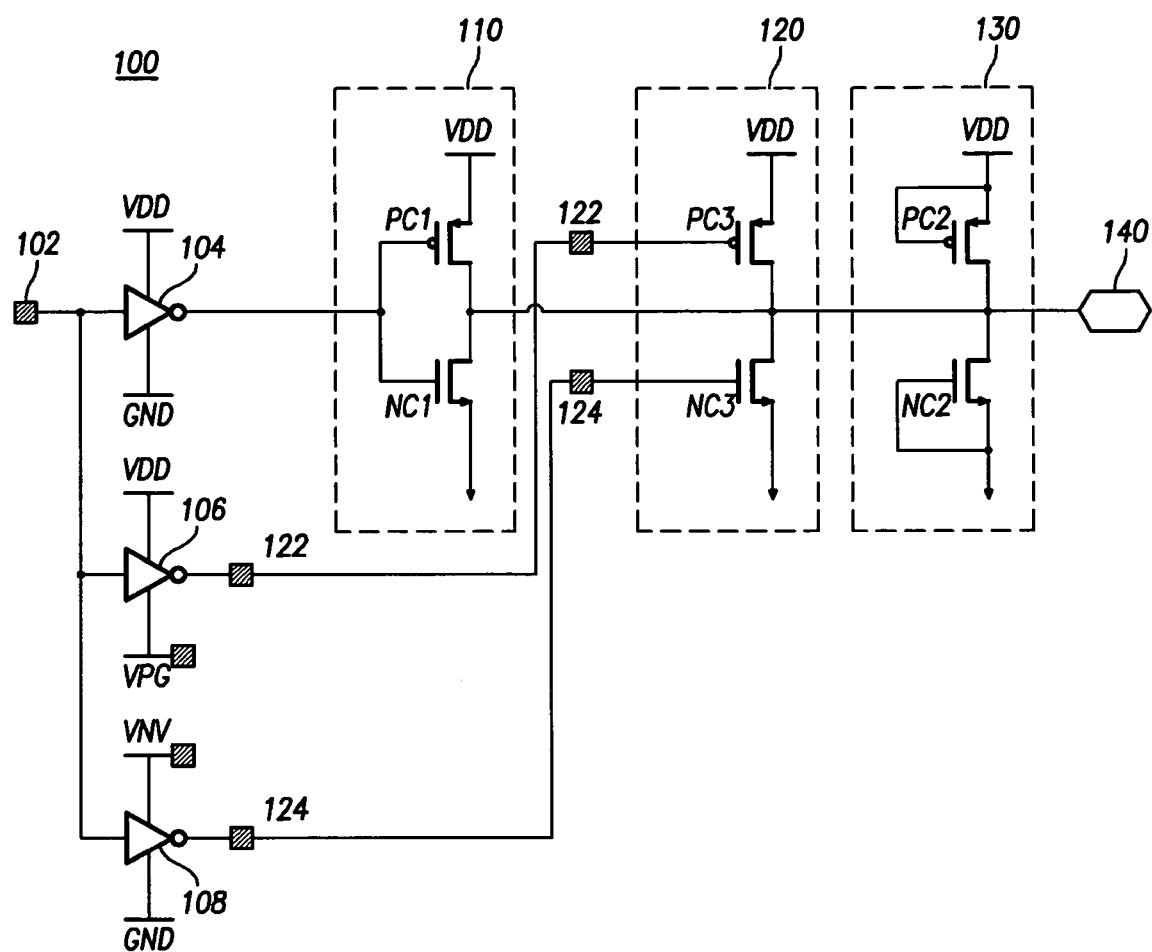
FIG. 2 is a circuit diagram of an I/O cell in accordance with an embodiment consistent with the present invention.

FIG. 2 is a block circuit diagram of an I/O cell 100 in accordance with an embodiment consistent with the present invention.

I/O cell 100 consistent with the present invention includes a first drive circuit 110 corresponding to a conventional drive circuit 20 and, additionally, a second drive circuit 120. Further, gates of transistors PC3 and NC3 constituting second drive circuit 120 have voltage signals ranging between power supply voltage VDD and VPG (>0) or between VNV (>0) and ground voltage as inputs, different from the gate of first drive circuit 110.

Further, I/O cell 100 consistent with the present invention includes a first drive stage 104 connecting the signal on terminal 102 to the gate input of first drive circuit 110, and, additionally, a second drive stage 106 connecting a signal on terminal 102 to a gate input of a PMOS transistor PC3 in second drive circuit 120 and a third drive stage 108 connecting the signal on terminal 102 to a gate input of an NMOS transistor NC3 in second drive stage 120.

First drive stage 104 is embodied by a PMOS transistor (not shown) and an NMOS transistor (not shown) connected in series between the power supply voltage and the ground (that is, embodied by an inverter) as is in conventional I/O cell 10, second drive stage 106 is embodied by an inverter between the power supply voltage and VPG voltage, different from conventional I/O cell, and third drive stage 108 is embodied by an inverter between VNV voltage and the ground.

Each transistor shown in FIG. 2 is formed of a basic transistor of the same size in order to perform an electrostatic protection function.

An electrostatic protection circuit 130 in I/O cell 100 shown in FIG. 2 is constituted by a PMOS transistor PC2 and an NMOS transistor NC2 as is in conventional I/O cell 10. Each of the transistors may be configured as a diode.

Figure 3:
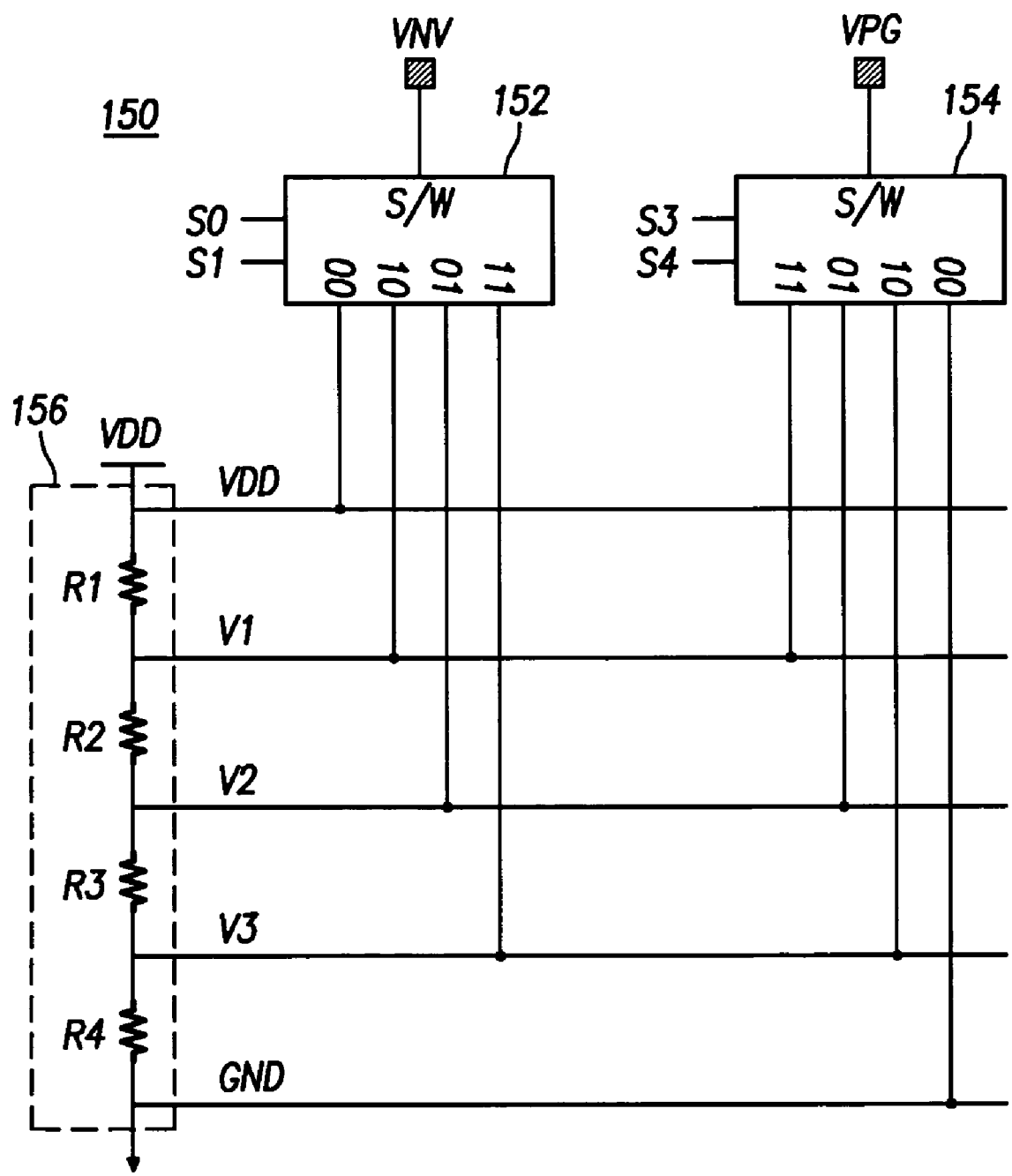
FIG. 3 is a circuit diagram of a gate bias voltage generator provided in a second drive circuit included in an I/O cell in accordance with an embodiment consistent with the present invention.

FIG. 3 is a circuit diagram of a gate bias voltage generator of the second drive circuit shown in FIG. 2.

Referring to FIG. 3, a gate bias voltage generator 150 includes a voltage divider 156 connected between a power supply voltage VDD and a ground GND, a VNV switching device 152 connected between voltage divider 156 and a VNV terminal, and a VPG switching device 154 connected between voltage divider 156 and VPG terminal.

Voltage divider 156 is comprised of a plurality of resistors R1, R2, R3 and R4 connected in series between power supply voltage VDD and ground GND, and outputs voltages V1, V2 and V3 which are divided by respective resistors, VDD, and ground GND. Switching device 152 connects outputs of voltage divider 156 to a VNV terminal through any of 4 output signal lines '00', '01', '10' and '11' according to values of 2 program signals S0 and S1.

For example, when values of S0 and S1 are "1" and "0", respectively, a signal line '10' of VNV switching device 152 is in an active state, such that a signal produced by dividing VDD by R3 and R4 in the voltage divider, V3[=VDD*(R3+R4)/(R1+R2+R3+R4)] is connected to VNV terminal.

VPG switching device 154 also connects the output of voltage divider 156 to VPG terminal through any of 4 signal lines, '00', '01', '10' and '11' to VPG terminal.

However, output signal lines of VNV switching device 152 and VPG switching device 154 are different from the output of voltage divider 156 in the connection structure. That is, while 4 output signal lines of VNV switching device 152 are connected to output lines of VDD, V1, V2 and V3, respectively, 4 output signal lines of VGP switching device 154 are connected to output lines of V1, V2, V3 and ground in voltage divider 156, respectively.

The reason why the connection structures are different with one another is that while VNV switching device 152 controls drive current of NMOS transistor NC3 in second drive circuit 120, VPG switching device 154 controls drive current of PMOS transistor PC3.

It is possible to control output voltages V1 to V3 and GND of voltage divider 156 shown in FIG. 3 by variously changing the number and value of the resistors. However, the number and value of the resistors should be changed in a range where values of the output voltages are higher than the difference between a threshold voltage of a pull-up transistor or a pull-down transistor in second drive circuit 120 and VDD or a difference between the threshold voltage and GND.

Operations of I/O cell 100 consistent with the present invention will be described with reference to FIGS. 2 and 3.

Depending on the signal on terminal 102, one of pull-up transistor PC1 and pull-down transistor NC1 in first drive circuit 110 is turned on, while the other is turned off. Accordingly, there appears a signal having the value of VDD or GND at the output pad 140.

However, since the gates of the pull-up transistor and the pull-down transistor in first drive circuit 110 have a signal ranging between VDD and GND input through first drive stage 104, a drive strength of first drive circuit 110 may be equal to a drive strength of the basic transistor, which may be, for example, 2 mA.

The signal on terminal 102 is input to second and third drive stages 106 and 108 as well as first drive stage 104 by the same value, so that, depending on the value, one of the PMOS transistor and the NMOS transistor in second and third drive stages 106 and 108 is turned on and while the other is turned off.

When a signal of data "1" appears at terminal 102, a pull-up transistor PC1 of first drive circuit 110 is turned on, so that output pad 140 is provided with a VDD signal whose drive strength is 2 mA, for example. Second drive stage 106 to which the signal "1" on terminal 102 is input, outputs VPG, and VPG is input to the gate of PMOS transistor PC3 in second drive circuit 120.

Therefore, depending on the voltage values of VPG signal generated in gate bias voltage generator 150, VDD signals of drive strength shown in Table 1 below are added to output pad 140. Meanwhile, third drive stage 108 outputs a GND signal, and GND signal is input to a gate of NMOS transistor NC3 in second drive circuit 120. Accordingly, NMOS transistor NC3 in second drive circuit 120 is turned off.

On the other hand, when a signal of data "0" appears at terminal 102, a pull-down transistor NC1 of first drive circuit 110 is turned on so that output pad 140 is provided with a GND signal whose drive strength is 2 mA, for example. Meanwhile, second drive stage 106 to which the signal "0" of terminal 102 is input, outputs VDD, and VDD is input to the gate of PMOS transistor PC3 in second drive circuit 120, so that PMOS transistor PC3 is turned off.

Third drive stage 108 outputs a signal of VNV and VNV is input to the gate of NMOS transistor NC3 in second drive circuit 120. Accordingly, GND signals having the drive strength shown in Table 1 below are added to output pad 140 depending on voltage values of VNV signals generated in gate bias drive generator 150 as shown in FIG. 3.

TABLE 1

| Gate Voltage | VDD | V1 | V2 | V3 | GND |
|---|---|---|---|---|---|
| PC3 | 0 | 0.1X mA | 0.5X mA | 0.9X mA | X mA |
| NC3 | X mA | 0.9X mA | 0.5X mA | 0.1X mA | 0 |

Numeral values '0.1', '0.5' and '0.9' in Table 1 can be changed depending on the number and value of resistors constituting voltage divider 156 and values of VNV and VPG, which are merely relative values for a drive strength (XmA=2 mA) of a basic transistor expressed in specific numeral values in order to better understand it.

As shown in FIG. 3, since values of VNV and VPG can be changed depending on program signals S0 to S4, it is possible to finely control the drive strength of second drive circuit 120 to a level less than the drive strength of the basic transistor by appropriately selecting the program signals.

Figure 4:
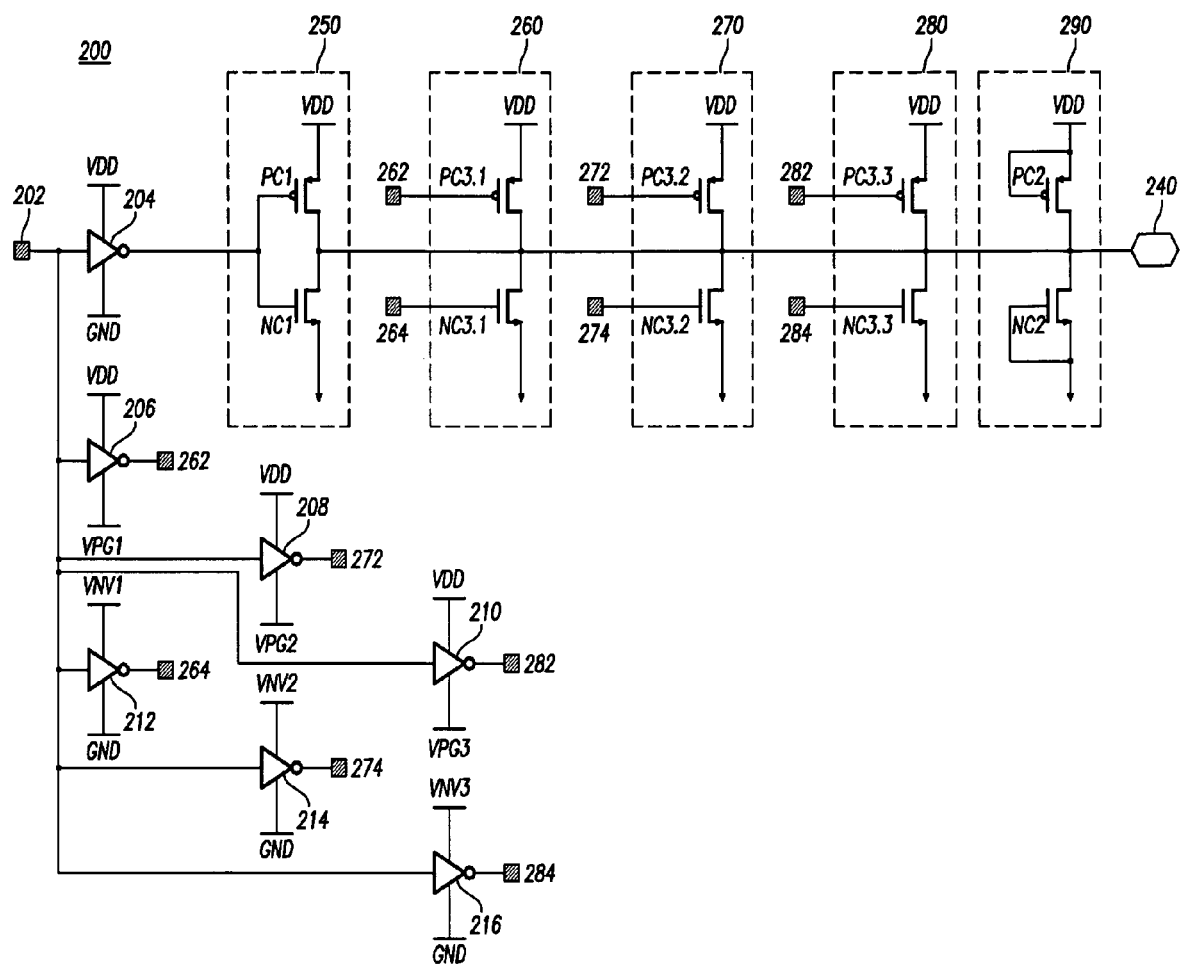
FIG. 4 is a circuit diagram of an I/O cell in accordance with another embodiment consistent with the present invention.
Figure 5:
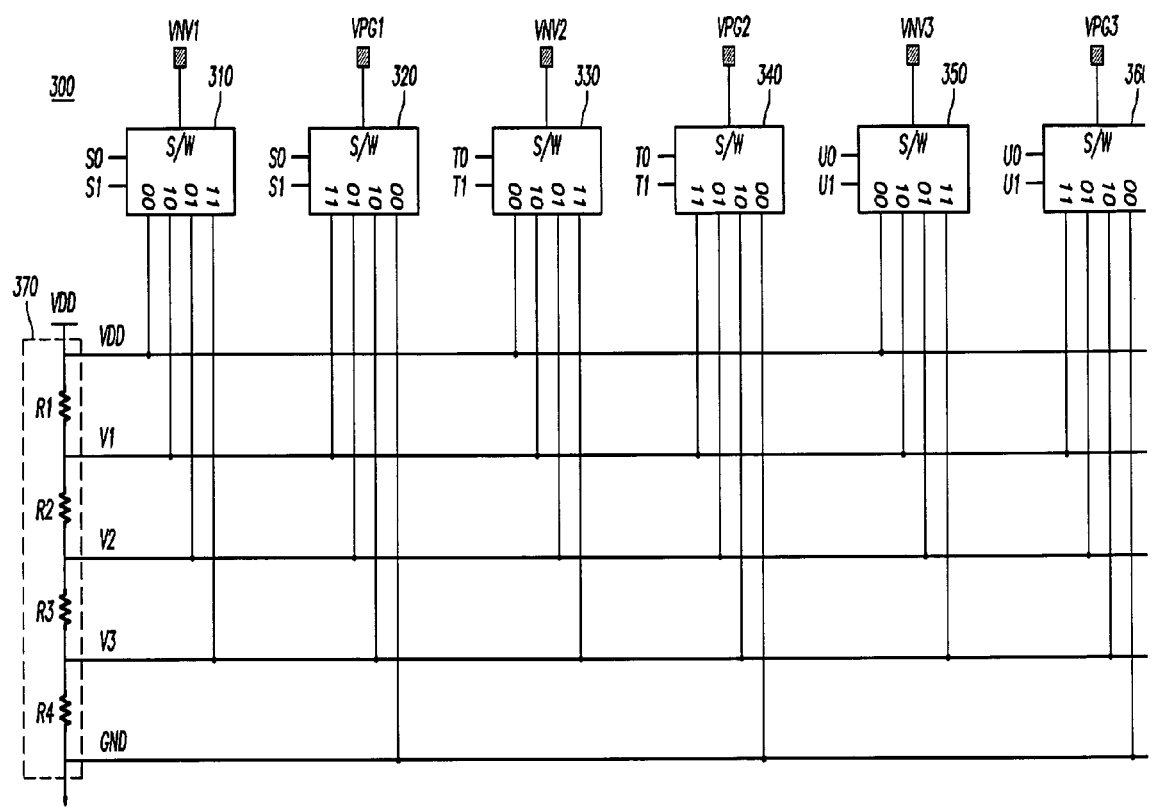
FIG. 5 is a circuit diagram of a gate bias voltage generator provided in a second drive circuit included in an I/O cell in accordance with another embodiment consistent with the present invention.

FIGS. 4 and 5 are circuit diagrams illustrating an I/O cell and a gate bias voltage generator in accordance with another embodiment consistent with the present invention.

Basic operations of I/O cell 200 and voltage generator 300 shown in FIGS. 4 and 5 are the same as those of I/O cell 100 and voltage generator 150 in the embodiment described above, except that, in order to control the drive strength more finely, the drive circuit is finely divided into sub-drive circuits. Second through fourth drive circuits 260, 270 and 280 and the switching device is extended to VNV1, VNV2 and VNV3 switching devices 310, 330 and 350, and VPG1, VPG2 and VPG3 switching devices 320, 340 and 360.

Referring to FIGS. 4 and 5, a signal on a terminal 202 is input to a first drive circuit 250 through a first drive stage 204 and, at the same time, to second through seventh drive stages 206, 208, 210, 212, 214 and 216. A voltage ranging between voltages VNV1, VNV2, VNV3 and VPG1, VPG2, VPG3 is generated by a gate bias voltage generator 300 and VDD or GND is input to gates of drive circuits 260, 270 and 280, and may control drive current for output pad 240 in a variety of manners.

Consistent with the present invention, the I/O cell can control current drive strength for the output pad in a variety of manners while operating as an electrostatic protection circuit, as well as support mobile equipment in a variety of operation modes.

Further, consistent with the present invention, unnecessary power consumption can be prevented in the semiconductor integrated circuit, an EMI problem can be solved, and changes of a VDD value caused by variously scaling the voltage can be efficiently be met without a timing problem.

It will be apparent to those skilled in the art that various modifications may be made without departing from the scope and spirit consistent with the invention as disclosed in the accompanying claims.

What is claimed is:

1. An I/O cell for providing an output pad with an output signal comprising:
    a first drive circuit for providing the output pad with an output signal having a drive strength which is equal to a drive strength required by a basic PMOS transistor or a basic NMOS transistor, the first drive circuit further operating as an ESD protection circuit to protect the output pad from any errant electrostatic signal input thereto;
    at least one second drive circuit connected between an output of the first drive circuit and the output pad, the second drive circuit operating as an ESD protection circuit to further protect the output pad from any errant electrostatic signal input thereto, wherein the second drive circuit includes:
        a PMOS transistor having a first pad, and
        an NMOS transistor having a second pad;
    a voltage generator for generating VNV and VPG voltages and having a voltage divider connected between a power supply voltage and a ground voltage, wherein the voltage generator includes a switching device:
        for selectively connecting an output of the voltage divider to a VNV voltage terminal, and
        for selectively connecting the output of the voltage divider to a VPG voltage terminal; and
    a second drive stage connected between the VNV voltage terminal and a ground voltage terminal, the second drive stage having an input receiving the input signal of the I/O cell and an output connected to the gate of the NMOS transistor of the second drive circuit.

2. The I/O cell according to claim 1, wherein the first drive circuit includes a pull-up transistor and a pull-down transistor connected in series between the power supply voltage and the ground voltage, wherein gate inputs of the pull-up and pull-down transistors include a signal ranging from the power supply voltage to the ground voltage.

3. The I/O cell according to claim 1, wherein the PMOS transistor in the second drive circuit has a source connected to the power supply voltage and a drain connected to the output pad.

4. The I/O cell according to claim 1, wherein the NMOS transistor in the second drive circuit has a source connected to the ground voltage and a drain connected to the output pad.

5. The I/O cell according to claim 1, wherein the switching device selectively connects the output of the voltage divider to the VNV voltage terminal and the VPG voltage terminal according to a program signal.

6. An I/O cell for providing an output pad with an output signal comprising:
    a first drive circuit for providing the output pad with an output signal having a drive strength which is equal to a drive strength required by a basic PMOS transistor or a basic NMOS transistor, the first drive circuit further operating as an ESD protection circuit to protect the output pad from any errant electrostatic signal input thereto;
    at least one second drive circuit connected between an output of the first drive circuit and the output pad, the second drive circuit operating as an ESD protection circuit to further protect the output pad from any errant electrostatic signal input thereto, wherein the second drive circuit includes:
        a PMOS transistor having a first pad, and
        a NMOS transistor having a second pad;
    a voltage generator for generating VNV voltage and VPG voltage and having a voltage divider connected between a power supply voltage and a around voltage, wherein the voltage generator includes a switching device:
        for selectively connecting an output of the voltage divider to a VNV voltage terminal, and
        for selectively connecting the output of the voltage divider to a VPG voltage terminal;
    a second drive stage connected between the VNV voltage terminal and a ground voltage terminal, the second drive stage having an input receiving the input signal of the I/O cell and an output connected to the gate of the NMOS transistor of the second drive circuit; and a third drive stage connected between a power supply voltage terminal and the VPG voltage terminal, whose input signal is the input signal of the I/O cell and the output is connected to the gate of the PMOS transistor of the second drive circuit.

7. The I/O cell according to claim 1, wherein the at least one second drive circuit comprises two or more second drive circuits.

8. The I/O cell according to claim 1, further comprising a third drive stage connected between a power supply voltage terminal and the VPG voltage terminal, the third drive stage having an input receiving the input signal of the I/O cell and an output connected to the gate of the PMOS transistor of the second drive circuit.

* * * * *